United States Patent [19]

Sumi et al.

[11] Patent Number: 5,496,432

[45] Date of Patent: Mar. 5, 1996

[54] METHOD AND DEVICE FOR PEELING A FILM

[75] Inventors: Shigeo Sumi; Kenji Kitagawa, both of Saitama, Japan

[73] Assignee: Somar Corporation, Tokyo, Japan

[21] Appl. No.: 327,384

[22] Filed: Oct. 21, 1994

[30] Foreign Application Priority Data

Jun. 6, 1994 [JP] Japan .................................. 6-124093

[51] Int. Cl.⁶ .................................................. B32B 31/00
[52] U.S. Cl. .......................................... 156/344; 156/584
[58] Field of Search ..................... 156/344, 584; 271/97, 280, 281

[56] References Cited

U.S. PATENT DOCUMENTS

| | | | |
|---|---|---|---|
| 5,277,738 | 1/1994 | Moser et al. | 156/584 X |
| 5,312,505 | 5/1994 | Sumi et al. | 156/584 |
| 5,389,192 | 2/1995 | Takimoto et al. | 156/584 |

Primary Examiner—Mark A. Osele
Attorney, Agent, or Firm—Sughrue, Mion, Zinn, Macpeak & Seas

[57] ABSTRACT

It is an object of the invention to provide film peeling method and device which, when a circuit board with laminated thin films coated on the front and back surfaces thereof is beaten by vibrator rods from the front and back sides thereof to thereby peel the film, can absorb variations in the coated positions of the front and back laminated thin films and also prevent the vibrator rods from being damaged when they beat each other idly.

Vibrators 16A, 16B are disposed on the front and back sides of a circuit board 14 with laminated thin films 12A, 12B coated on the front and back surfaces thereof, back and front back-up rollers 24B, 24A are disposed at positions respectively opposed to the front and back rods 18A, 18B of the vibrators 16A, 16B, and the back and front back-up rollers 24B, 24A are moved synchronously with the front and back rods 18A, 18B, respectively.

35 Claims, 5 Drawing Sheets

METHOD AND DEVICE FOR PEELING A FILM

BACKGROUND OF THE INVENTION

1. Field of the Invention

The present invention relates to method and device for peeling a film laminated on a printed circuit board or the like.

2. Description of the Related Art

A printed circuit board for use in electronic equipment includes an insulation panel and wiring. The wiring is made of a material such as copper and has a given pattern formed on either one surface or both surfaces of the insulation panel. This type of printed circuit board is manufactured by the following process.

A laminated member consisting of a photosensitive resin (photoresist) layer and a light transmissive resin film (a protective film) is laminated by thermal pressure on a conductive layer provided on an insulation panel by use of a roller. Next, a wiring pattern film is further put on the laminated member, and the photoresist layer is exposed to light for a given period of time through the wiring pattern film and light transmissive resin film. After the light transmissive resin film is peeled off, the exposed photoresist layer is developed to thereby form an etching mask pattern. Then the unnecessary portions of the conductive layer are removed by etching, so that a printed circuit board having a given wiring pattern is formed.

Conventionally, there have been methods and devices for automatically peeling the above-mentioned protective film in the manufacturing process of the printed circuit board. For example, in Japanese Patent Publication No. 6-3550 of Heisei, a thin film peeling device includes a floating means which beats the end portion of a laminated thin film (consisting of a photoresist layer and a light transmissive resin film respectively put on a circuit board) with the vibration of a rod of a vibrator, to thereby float part of the light transmissive film from the photoresist layer.

When two laminated thin films are respectively put on both of the front and back surfaces of the circuit board, two vibrator rods are respectively provided on the front and back sides of the circuit board in such a manner that they are mutually opposed to each other. Thus, by beating synchronously the front and back sides of the circuit board with the leading ends of the rods through the laminated thin films, the circuit board is allowed to receive the same force from the front and back sides. The result is to prevent distortion of the circuit board.

However, when the two laminated thin films are coated on the front and back sides of the circuit board as mentioned above, the coated positions can vary relative to each other. In this case, the positions of the end portions of the laminated thin films in the advancing direction of the circuit board raise a problem in connection with the peeling positions thereof. To absorb such great variations, it can be expected that, while moving the leading ends of the rods in a relatively great stroke from the positions of the end portions of the mutually displaced films, the end portions of the laminated thin film are beaten assuredly by the rods leading ends to thereby float the same.

In this case, the positions of the ends of the laminated thin films are detected by a sensor to thereby determine the starting points of vibration application by the rods of the vibrators. However, if the starting points are very close to the leading end of the circuit board in the advancing direction thereof, then the leading ends of the vibrator rods may perform a circuit board beating operation off of the circuit board. This causes the two rods leading ends to beat each other idly and thereby damage themselves.

Also, when a pair of vibrator rods are disposed on the front and back sides of a thin circuit board in a mutually opposing manner as in the above-mentioned conventional peeling device, then the circuit board is caused to deform. Therefore, the positions of the upper and lower rods must be set with considerably high precision.

SUMMARY OF THE INVENTION

The present invention aims at eliminating the above drawbacks found in the above-mentioned conventional film peeling method and device. It is an object of the invention to provide a film peeling method and device which prevents damage to front and back rods resulting from hitting each other even if the range of vibration application by the rods of the vibrators is large, and also permits the displacement between the positions of the rods ends of the vibrators during the setting stage.

In attaining the above object, according to the invention, there is provided a film peeling method in which two laminated thin films each consisting of a photoresist layer and a light transmissive film are respectively coated on the front and back surfaces of a circuit board, two vibrators each including a rod are respectively disposed above and below the circuit board in such a manner that they surround the circuit board from the front and back surfaces of the circuit board respectively as well as the leading ends of the rods are disposed to face each other with the circuit board between them, the vibratory motions of the rods are applied onto the end portions of the respective laminated thin films coated on the front and back surfaces of the circuit board to thereby float part of the light transmissive films from the associated photoresist layers, and the films are peeled off from the floated portions of the light transmissive films, the method comprising the steps of: setting the positions of the front and back rods leading ends with respect to the circuit board so as to offset each other along the surface of the circuit board, back and front backup members are respectively disposed in such positions as are respectively opposed to the front rod leading end and the back rod leading end through the circuit board and the laminated thin films, and the back and front backup members are moved along the circuit board and the two laminated thin films respectively in synchronization with said mutually facing front and back rod leading ends.

The starting points of application of the vibratory motions to the laminated thin films by the rod leading ends may be respectively set as the end portions of the laminated thin films on the front and back surfaces of the circuit board further distant from the end edge of the adjoining circuit board, and the front and back rod leading ends as well as the back and front backup members may be moved by a given distance from the starting points while the vibratory motions are being applied to the laminated thin films. Further, the back and front backup members may be rollers which are in rollable contact with the laminated thin films in the rod moving direction.

Moreover, in attaining the above object, according to the invention, there is provided a film peeling device which includes film floating means, after two laminated thin films each consisting of a photoresist layer and a light transmissive film are respectively coated on the front and back surfaces of a circuit board, two vibrators each including a rod are respectively disposed above and below the circuit board in such a manner that they surround the circuit board from the front and back surfaces of the circuit board respectively as well as the leading ends of the rods are disposed to face each other with the circuit board between them, for applying the vibratory motions of the rods onto the end portions of the laminated thin films respectively coated on the front and back surfaces of the circuit board to thereby float part of the light transmissive films from their respective photoresist layers, and film peeling means for peeling the films in the floated portions of the light transmissive films, wherein the positions of the front and back rods leading ends with respect to the circuit board are set so as to offset each other along the surface of the circuit board, and also wherein the film peeling device further includes back and front backup members respectively provided at positions opposed to the front and back rods leading ends through the circuit board and the laminated thin films and movable in contact with and along the circuit board and the laminated thin films in synchronization with the opposed front and back rods leading ends.

According to the invention, the back and front backup members may be respectively supported by the support members of the back and front vibrators. The back and front backup members may be formed of hard rubber and may also be rollers.

The film floating means may be so structured as to include rod moving means which moves the front and back rods leading ends relatively in the advancing direction of the circuit board. Moreover, the film floating means may include film leading end sensors and a control device. The film leading end sensors respectively detect the leading ends of the front and back laminated thin films in the advancing direction of the circuit board. The control device detects the leading end of the laminated thin film existing further distant from the leading end of the circuit board in the advancing direction in accordance with output signals from the film leading end sensors, controls the rod moving means to position the front and back rods leading ends at the detected leading end, and moves them by a given distance from the position in the circuit board advancing direction.

The laminated thin film sensors each includes a pair of conductive contacts disposed spaced apart from each other in the width direction of the circuit board and contactable with the surfaces of the circuit board and the laminated thin films respectively coated on the circuit board. The laminated thin film sensors runs over the laminated thin films when the pair of conductive contacts come into contact with conductive layers respectively provided on the surfaces of the circuit board, and outputs a thin film detect signal when the conduction is cut off.

According to the method of the invention, back and front backup members serve as receiving members when laminated thin films are beaten by the rods leading ends. Due to the fact that the back and front backup members are respectively disposed at positions opposed to the front and back rods leading ends through the laminated thin films and circuit board, even if the leading ends of the front and back rods are so disposed as to offset each other along the surface of the circuit board and the front and back surfaces of the circuit board are beaten at different positions by the offset leading ends, the circuit board cannot be distorted. This permits some difference in position between the front and back rods leading ends when their positions are set. Also, since the front and back rods leading ends do not face each other, even when the rods leading ends slip off the circuit board, they will not beat each other idly resulting in damage to each other.

Even if the positions of the end portions of the front and back laminated thin films on the circuit board are much different from each other, the films can still be peeled assuredly.

If the backup members are rollers which are in rollable contact in the rod moving direction, they do not rub against the films while they are in motion. Also, as they are in direct contact with and are rotated with respect to the rods leading ends, they are not beaten at the same position by the rods leading ends and, therefore, receive little damage.

According to the device of the invention, even if the front and back rods leading ends are displaced in position from each other, the circuit board cannot be distorted, thus, positional displacement of the front and back rods leading ends is permitted. Further, even if the rods are vibrated at positions off the circuit board, the front and back rods leading end will not beat each other idly resulting in damage to each other.

If the front and back rods are moved synchronously, then the back and front backup members are moved together with them so that the back and front backup members are always respectively positioned opposed to the associated front and back rods leading ends.

If the backup members are formed of hard rubber, they can absorb shocks given by the opposed rods leading ends. Also, since they are in surface contact with the circuit board and laminated thin films, some positional difference with respect to their respective opposed rods leading ends can be allowed.

If the front and back backup members are rollers, they do not rub against the film surfaces when the rods are moved. Also, when beating idly, the rods leading ends do not beat the same portion repeatedly and, therefore, the backup members receive little damage.

The rods leading ends and the back-up rollers opposed to them can be set at an arbitrary position of the laminated thin films coated on the circuit board by means of the rod moving means. Even when there exists a difference in the coated position between the front and back laminated thin films, it is possible to assuredly operate the rods leading ends to thereby float the films.

The leading end positions of the front and back laminated thin films are detected by the film leading end sensors. With one of the leading ends which is further distant from the leading end of the circuit board set as a reference, the front and back rods leading ends are set. Under the control of the control device, the front and back leading ends are moved in a given range while they are beating the front and back laminated thin films, thereby being able to float the films assuredly.

When a pair of conductive contacts provided in the laminated thin film sensor run onto the laminated thin film, the leading end of the laminated thin film can be detected.

DESCRIPTION OF THE PREFERRED EMBODIMENTS

Now, description will be given hereinbelow of an embodiment of film peeling method and device according to the invention with reference to the accompanying drawings.

Figure 1:
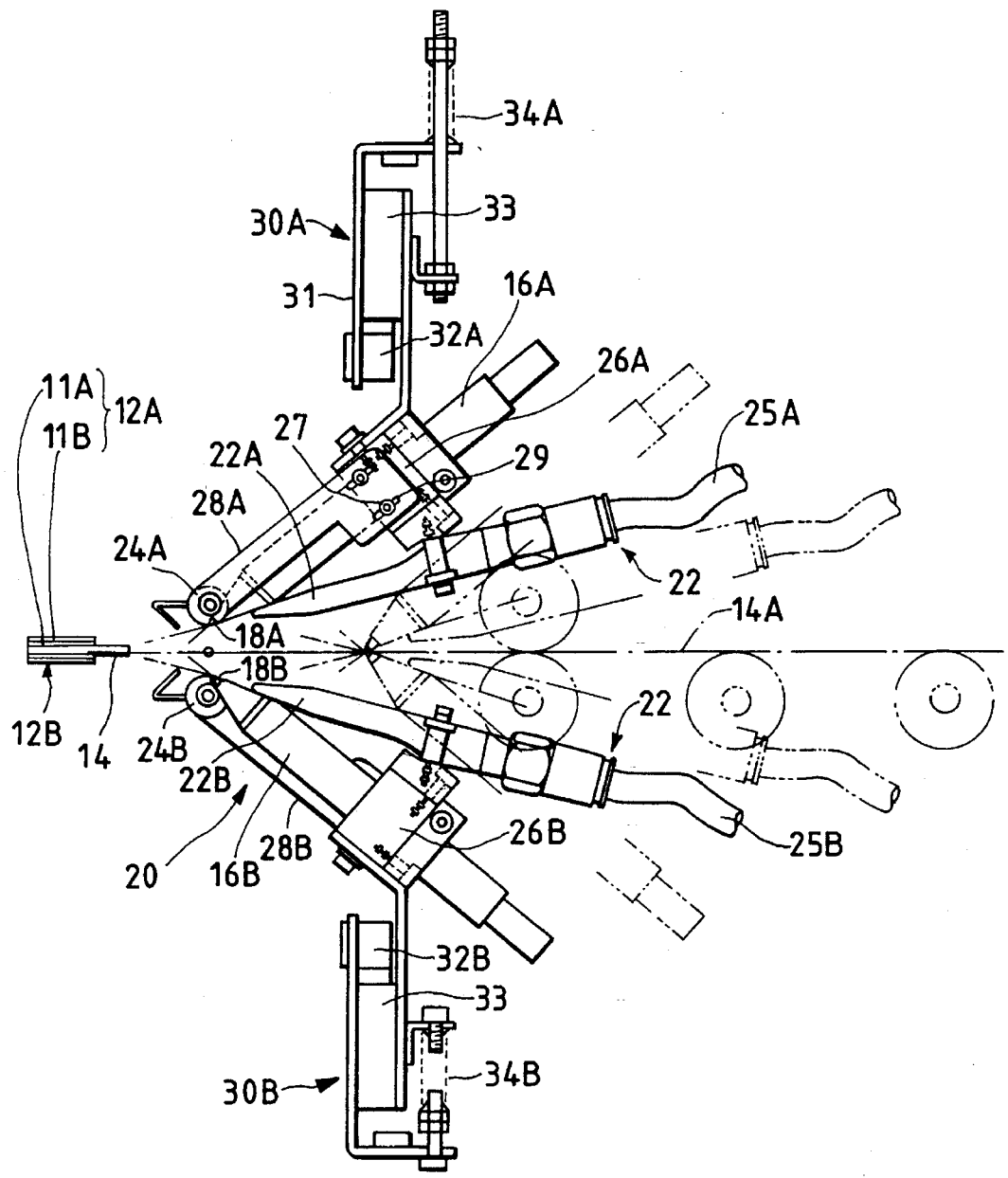
FIG. 1 is an enlarged side view of the main portions of an embodiment of a film peeling device according to the invention.

According to the present embodiment as shown in FIG. 1, there is provided a film peeling device 10 in which two laminated thin films 12A, 12B each consisting of a photoresist layer 11A and a light transmissive resin film 11B are respectively coated on the front and back surfaces of a circuit board 14 to advance along a pass line 14A. A pair of front and back vibrators 16A and 16B respectively including front and back rods 18A and 18B are respectively disposed above and below the circuit board 14 in such a manner that they surround the circuit board from the front and back surfaces of the circuit board 14 respectively. The leading ends of the front and back rods 18A and 18B are disposed to face each other with circuit board 14 between them. The peeling device 10 includes film floating means 20 which applies the vibratory motions of the front and back rods 18A, 18B to the end portions of the front and back laminated thin films 12A, 12B to thereby float part of the light transmissive resin film 11B from the photoresist layer 11A, and film peeling means 22 for peeling the thus floated portion of the light transmissive resin film 11B. Also, according to the present film peeling device 10, the positions of the leading ends of the front and back rods 18A, 18B with respect to the circuit board 14 are arranged to offset each other along the surface of the circuit board 14 in a direction of the width of the circuit board 14 and perpendicular to the advancing direction of the circuit board 14.

A back back-up roller 24B and a front back-up roller 24A are disposed at positions opposed to the leading ends of the front and back rods 18A and 18B, respectively, through the circuit board 14 and two laminated thin films 12A, 12B. These rollers are movable in rolling contact with and along the circuit board 14 and laminated thin films 12A, 12B in synchronization with the leading ends of the mutually opposing front and back rods 18A and 18B. The front back-up roller 24A is supported by a support member 26A of the front vibrator 16A and the back back-up roller 24B is supported by a support member 26B of the back vibrator 16B, respectively. The front and back back-up rollers 24A, 24B are each formed of a hard rubber ring which is rotatably supported on a rotary shaft extending in a direction perpendicular to the advancing direction of the circuit board 14.

Two film peeling means 22 are disposed respectively up and down in FIG. 1 in a manner to correspond to the front and back vibrators 16A, 16B, and respectively include air nozzles 22A, 22B each of which has a flat and fan-shaped leading end portion. The air nozzles 22A, 22B are respectively fixed to the support members 26A, 26B and are positioned in such a manner that the axes of the air nozzles respectively circumscribe the arcs of the front and back back-up rollers 24A and 24B on the respective sides of the pass line 14A of the circuit board 14. Air hoses 25A, 25B are used to supply air pressure to the air nozzles 22A, 22B, respectively.

The front and back back-up rollers 24A and 24B are supported by the support members 26A and 26B through support frames 28A and 28B, respectively. The support frames 28A, 28B respectively include elongated holes 29 extending in parallel to the axes of the rods 18A, 18B. The support frames 28A, 28B are engaged in the elongated holes 29 with bolts 27 provided in the rod support members 26A, 26B, whereby the position of the support frames 28A, 28B can be freely adjusted in the rod axial directions.

The rod support members 26A, 26B are both supported such that their position can be freely adjusted in the vertical direction through linear ways 30A, 30B which extend vertically. The linear ways 30A, 30B are respectively arranged such that the fixed-side members thereof 31 are respectively fixed to horizontal bars 32A, 32B, and the vertically movable members 33 thereof are respectively supported slidably with respect to the fixed-side members 31 in such a manner that they are energized upwardly by springs 34A, 34B respectively.

The horizontal bars 32A, 32B are respectively arranged horizontally above and below the pass line 14A and in parallel to the leading end of the circuit board 14. The two ends of the horizontal bars 32A, 32B in the longitudinal direction thereof project out from the right and left side walls 35 of the device and thus, as shown in FIGS. 2 and 3, the horizontal bars 32A, 32B are connected at the projecting ends thereof to the upper and lower ends of upper and lower racks 36A and 36B, respectively.

The upper and lower racks 36A and 36B are respectively meshable with a pinion 38 disposed at a position level with the pass line 14A, so that they can be moved vertically in a direction to approach and to move away from the pass line 14A in synchronization with each other. More specifically, an air cylinder 40 is connected to the upper rack 36A and, by driving the upper rack 36A with the air cylinder 40 through the upper horizontal bar 32A, the lower rack 36B can be driven through the pinion 38 in synchronization with upper rack 36A. The upper rack 36A, lower rack 36B, pinion 38, and air cylinder 40 are respectively disposed at the two ends of the upper and lower horizontal bars 32A, 32B and are arranged such that they can move the horizontal bars 32A, 32B vertically in synchronization with the right and left portions thereof while maintaining the horizontal states thereof.

Additionally, a pair of right and left front vibrators 16A, a pair of right and left back vibrators 16B, a pair of right and left front back-up rollers 24A, and a pair of right and left back back-up rollers 24B are provided for each of the horizontal bars 32A, 32B. Two air nozzles 22A and two air nozzles 22B are mounted on each of the vibrators. Therefore, according to the structure of the present embodiment, one back-up roller and two air nozzles can be moved integrally with one vibrator.

Figure 2:
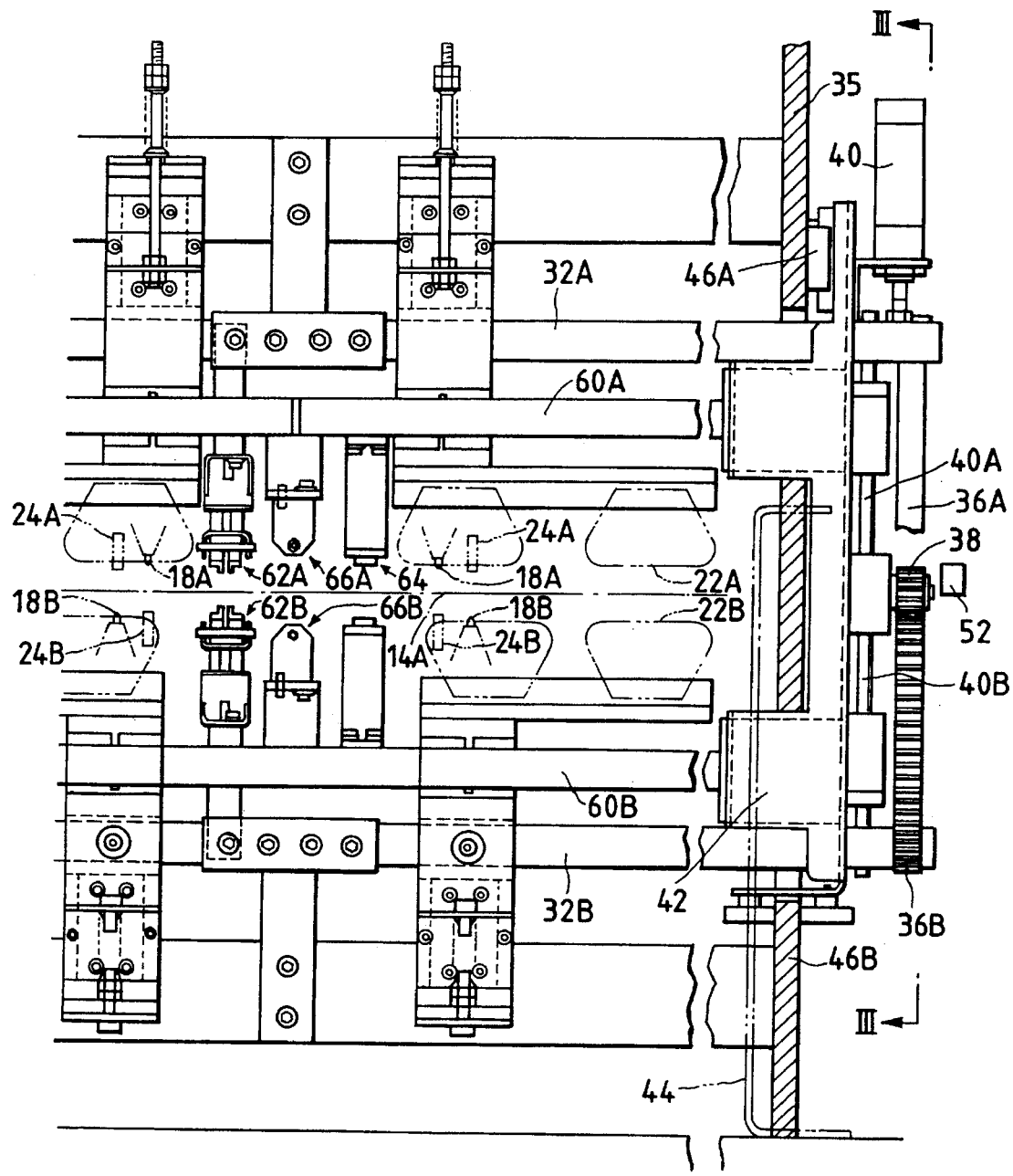
FIG. 2 is a back view of the film peeling device according to the above embodiment of the invention.
Figure 3:
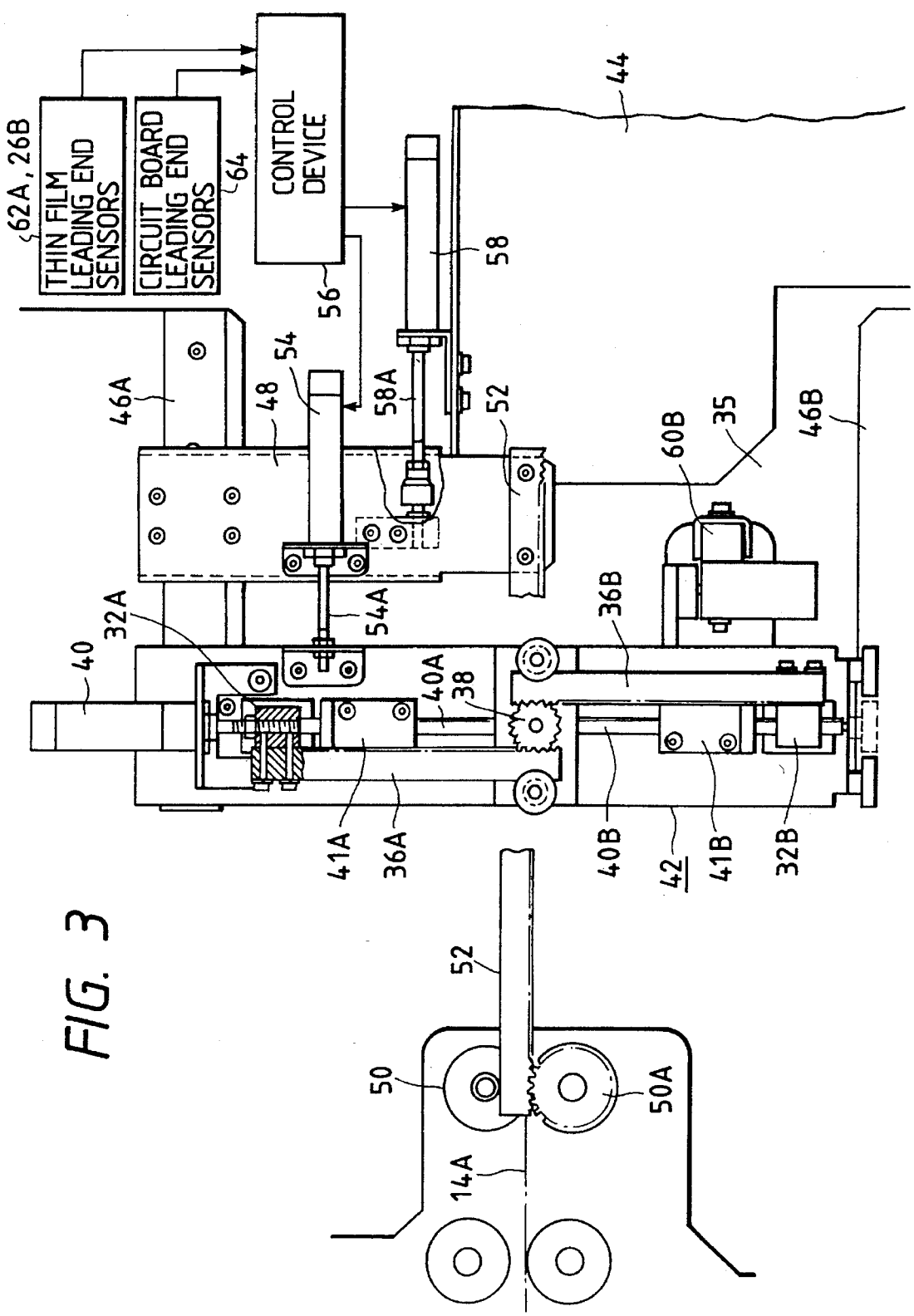
FIG. 3 is a side view of a portion corresponding to the line III—III shown in FIG. 2.

In FIGS. 2 and 3, reference characters 40A and 40B respectively designate vertically extending guide rods which respectively extend slidably through the horizontal bars 32A, 32B to guide them. The guide rods 40A and 40B are supported by a movable block 42 through fixed blocks 41A and 41B, respectively. The movable block 42 supports the upper and lower racks 36A, 36B, pinion 38, and guide rods 40A, 40B and is also supported such that it is movable in parallel with the pass line 14A along a guide rail 46A provided on the outside of the side wall 35 and a guide rail 46B provided in part of the side wall 35. Additionally, in the upper guide rail 46A, there is provided a second movable block 48 in such a manner that it is movable in parallel with the pass line 14A similarly to the movable block 42.

The lower end of the second movable block 48 is in mesh with a pinion 50A operable in linking with a feed roller 50 for feeding the circuit board 14 and is connected to a horizontally extending rack 52 to be driven by the pinion 50A, whereby the second movable block 48 can be advanced in synchronization with the circuit board 14 to be fed by the feed roller 50. In the second movable block 48, there is provided an air cylinder 54 including a rod 54A which is connected with the movable block 42. The air cylinder 54 allows the movable block 42 to move along the pass line 14A in a given range with respect to the second movable block 48. A relative position between the movable block 42 and second movable block 48 can be controlled by controlling the air cylinder 54 by means of a control device 56 shown in FIG. 3. A rod 58A of a second air cylinder 58 mounted on the side of the side wall 44 is connected to the second movable block 48. Thus, the second movable block 48 can be reciprocated together with the rack 52 along the pass line 14A by the second air cylinder 58. Therefore, the circuit board 14 is driven in synchronization with the second movable block 48 by the second air cylinder 58 through the rack 52 and pinion 50A.

After a circuit board is fed out on completion of a film peeling operation, the rack 52 and second movable block 48 are returned by the second air cylinder 58 to their wait positions where they wait for a next circuit board. In this operation, a one-way bearing (not shown) is fitted into the pinion 50A to thereby prevent reversal of the feed roller 50.

Figure 4:
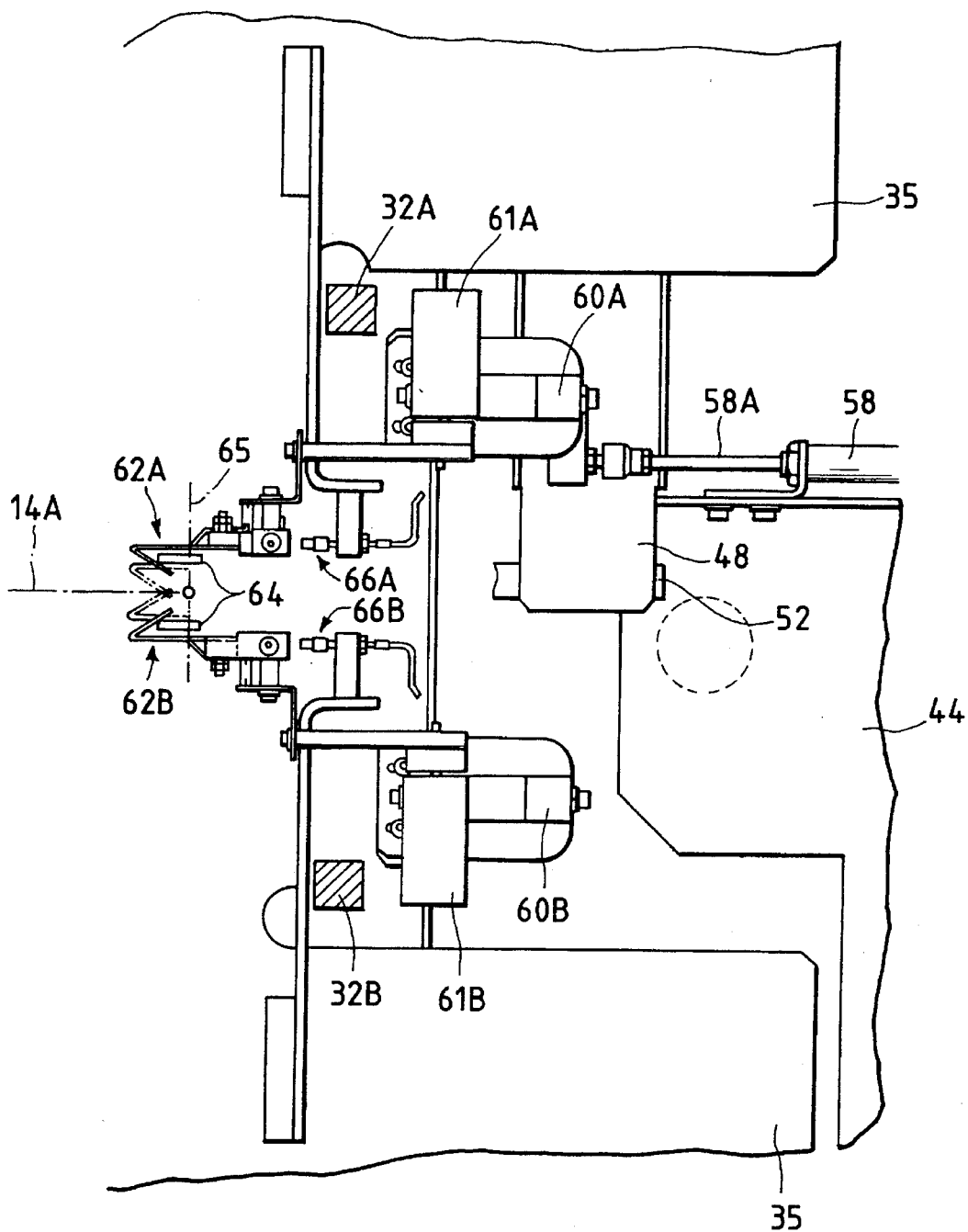
FIG. 4 is a side view of a portion of the above film peeling device in the neighborhood of sensors.

Upper and lower second horizontal bars 60A, 60B are supported by the movable block 42 integrally therewith. The second horizontal bars 60A, 60B are disposed in parallel to the upper and lower horizontal bars 32A, 32B and are spaced therefrom at equal distances, whereas they are fixed in the pass line 14 direction. As shown in FIGS. 2 and 4, thin film leading end sensors 62A, 62B and circuit board leading end sensors 64 are respectively supported by the movable block 42 through air cylinders 61A, 61B. These sensors are interposed together with peel film sensors 66A, 66B between the above-mentioned pairs of right and left, front and back rods 18A, 18B. They are arranged in the pass line 14A direction sequentially in the order of the thin film leading end sensors 62A, 62B, circuit board leading end sensors 64, and peel film sensors 66A, 66B.

Figure 5:
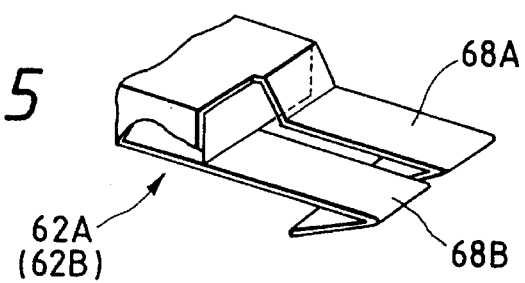
FIG. 5 is an enlarged perspective view of a thin film leading end sensor employed in the above embodiment; and, FIGS. 6(A)–6(E) are general views to show the operation of the above thin film leading end sensor.
Figure 6A:
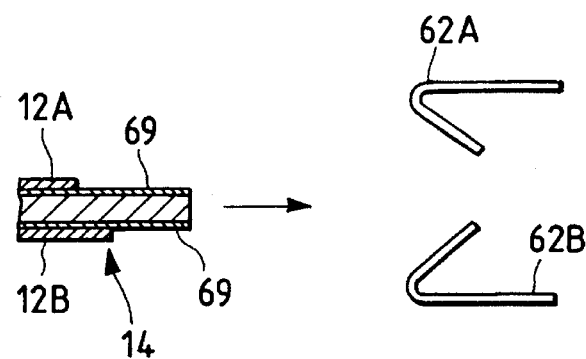
Figure 6B:
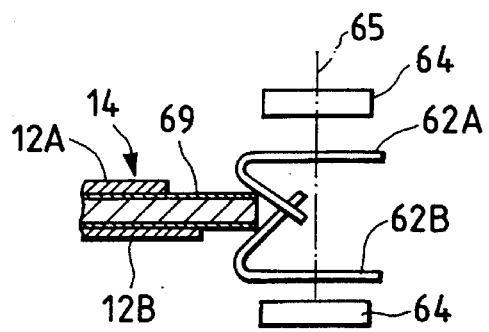
Figure 6C:
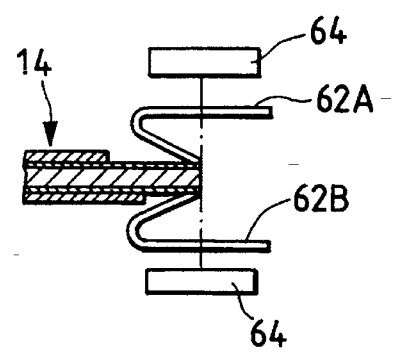
Figure 6D:
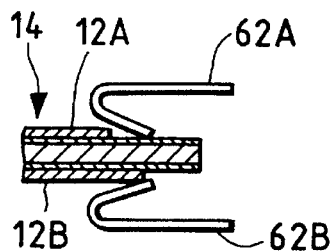
Figure 6E:
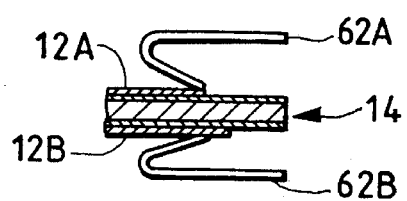

As shown in FIG. 5, the thin film leading end sensors 62A, 62B each includes a pair of conductive contacts 68A, 68B which are separated from each other in the circuit board width direction and can be made to conduct when they are contacted by the leading ends of conductive layers respectively coated on the front and back sides of the circuit board 14. That is, when the conductive contacts 68A, 68B are caused to go up onto the leading end portions of the associated laminated thin films to thereby stop conduction, then the thin film leading end sensors 62A, 62B respectively output leading end detect signals to the control device 56.

The circuit board leading end sensors 64 are optical sensors which detect the leading end of the circuit board 14 when light between the sensors 64 is shielded by the leading end of the circuit board 14 and thereafter outputs a detect signal to the control device 56. The peel film sensors 66A, 66B are optical sensors which detect the films peeled by the film floating means 20 and film peeling means 22. When the thin film leading end sensors 62A, 62B, are in detection, they are made to approach the pass line 14A by the air cylinders 61A, 61B. Immediately after they detect the leading ends of the thin film, they are inverted and returned to their original positions spaced apart from the pass line 14A by the air cylinders 61A, 61B.

Next, description will be given below of the operation of the above-mentioned device according to the invention.

At first, with the second movable block 48 positioned and fixed at its wait position by the second air cylinder 58 as a standard, the movable block 42 is moved and positioned in a pass line direction shown in FIG. 4 by the air cylinder 54. Also, the thin film leading end sensors 62A, 62B are pushed out in the pass line direction from a state shown in FIG. 6 (A) to a state shown in FIG. 6 (B) by the air cylinder, thereby preparing for detection of the conductive layer of the circuit board 14. In this state, the circuit board 14 with the laminated thin films 12A, 12B coated on the front and back surfaces thereof is fed along the pass line 14A by the feed roller in the direction of the sensors, film floating means 20, and film peeling means 22.

When the leading end of the circuit-board 14, as shown in FIG. 6 (C), enters between the upper and lower conductive contacts, opens them, and then reaches a circuit board leading end detect line designated by 65 in FIG. 4, this is detected by the circuit board leading end sensors 64. Responsive to the detection, the conductive contacts 68A, 68B of the upper and lower thin film leading end sensors 62A, 62B are contacted into conduction with the conductive layer (Cu foil)69 of the circuit board 14. Next, the laminated thin films 12A, 12B are contacted with the conductive contacts 68A, 68B of one or both of the thin film leading end sensors 62A, 62B, thereby cutting off the conduction of the conductive contacts 68A, 68B. When the control device 56 determines that the thin film leading end sensors 62A, 62B detect the leading ends of both of the laminated thin films 12A, 12B coated on the front and back surfaces of the circuit board 14. The second movable block 48 is pulled by the air cylinder 58, whereby the circuit board 14 is advanced in synchronization with the second movable block 48 by the pinion 50A through the rack 52. Then, the upper and lower horizontal bars 32A, 32B are driven by the air cylinder 40 through the racks 36A, 36B to thereby set the vertical positions of the front and back vibrators 16A, 16B, front and back rod 18A, 18B, front and back back-up rollers 24A, 24B, and air nozzles 22A, 22B. As the setting positions thereof, the leading ends of the rods are so arranged as to be contactable with the inner portions of the thin film leading ends on the surfaces of the thin films.

Just as the circuit board 14 advances and both of the upper and lower thin film leading end sensors 62A, 62B are turned off, air pressure is fed to the second air cylinder 58, air cylinder 40 and vibrators 16A, 16B and, after an instant, air pressure is supplied to the air cylinder 54 as well. At the same time, air pressure is jetted out from the air nozzles 22A, 22B. During this operation, the air of the air cylinders 61A, 61B, which press the thin film leading end sensors 62A, 2B against the circuit board 14, is removed and thus these sensors 62A, 62B are situated at positions apart from the circuit board 14.

When the movable block 42 and second movable block 48 start to move horizontally, the vibrators 16A, 16B are caused to start vibratory motions and the front and back rods 18A, 18B come into Contact with the circuit board 14. Then, the movable block 42 is driven so as to narrow the distance between the second movable block 48.

In the above process, the air cylinder 54 pulls the movable block 42 by a set distance. Therefore, while the leading ends of the front and back rods 18A, 18B are moving synchronously with the laminated thin films 12A, 12B and circuit board 14, and are also beating the laminated thin films 12A, 12B only for a previously set distance, the leading ends of the front and back rods 18A, 18B move in the leading end direction of the circuit board 14. If the stroke of the front and back rods 18A, 18B in such movements is set large, then variations in the distance between the leading ends of the laminated thin films 12A, 12B and the leading end of the circuit board 14 can be absorbed. This makes it possible for the rods to beat assuredly the leading ends of the laminated thin films.

When the leading ends of the laminated thin films 12A, 12B are beaten by the front and back rods 18A, 18B, then the light transmissive resin films 11B of the laminated thin films 12A, 12B are caused to float up from the photoresist layers 11A. If air pressure is jetted out to the floated portions from the air nozzles 22A, 22B, then the floated portions are peeled. After being peeled, the light transmissive resin films 11B are removed sequentially from the circuit board 14 starting at the peeled portions by a film feed device (not shown), and are discharged out externally of the pass line.

In this operation, although the front and back rods 18A, 18B are offset in the width direction of the circuit board 14, the back-up rollers 24B, 24A are respectively arranged on the opposite sides of the front and back rods 18A, 18B through the circuit board 14 and, therefore, even if the rods beat the circuit board 14 simultaneously from the front and back sides thereof, there is no possibility that the circuit board 14 can be distorted.

Also, when the front and back rods 18A, 18B are moved relative to the circuit board 14 by the air cylinder 54 through the movable block 42, there is no possibility that the front and back rods 18A, 18B can beat each other even if they are moved past the leading end of the circuit board 14 and, therefore, the rods are prevented from being damaged due to their idle beating.

Further, since the back and front back-up rollers 24B, 24A disposed opposed to the front and back rods 18A, 18B are respectively formed of hard rubber, they can be in surface contact with the circuit board 14 and laminated thin films 12A, 12B and, therefore, even if the positions of the back-up rollers are slightly shifted with respect to those of the opposed rods, the circuit board can be held assuredly when it is beaten by the rods.

After the light transmissive resin film 11B is peeled, the circuit board 14 is caused to pass through the position of the second movable block 48, and is then discharged out of the device. The movable block 42, second movable block 48, and rack 52 are then returned to their respective wait positions by the air cylinder 58. This process is then repeated to thereby peel more films.

As described above, in the above-mentioned embodiment, the back-up rollers 24A, 24B are formed of hard rubber. However, this is not limitative. The back-up rollers may also be formed of soft rubber, metal, rubber plate member or the like, provided that they can withstand the shocks to be given onto the circuit board 14 by the leading ends of the rods 18A, 18B.

Additionally, the back-up rollers 24A, 24B are supported by the vibrator support members 26A, 26B in the above-mentioned embodiment. However, the invention is not limited to this. The back-up rollers can be supported independently, provided that they can be moved in synchronization with the opposed rod leading ends.

The particular structure shown in FIGS. 1–3 for performing the functions of film floating, film peeling, and rod moving represent exemplary cases only and are not to be construed in a limiting fashion. It will be appreciated that any association of elements capable of accomplishing film floating, film peeling, or rod moving would work acceptably in the inventive combination, and Applicant intends that, in its broadest aspects, the present invention is to be limited to that specific structure which is capable of film floating, film peeling, or rod moving.

Although the invention has been described with reference to a specific embodiment, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A film peeling method in which two laminated thin films each consisting of a photoresist layer and a light transmissive film are respectively coated on the front and back surfaces of a circuit board, two vibrators each including a rod are respectively disposed above and below the circuit board in such a manner that they surround the circuit board from the front and back surfaces of the circuit board respectively as well as the leading ends of the rods are disposed to face each other with the circuit board between them, the vibratory motions of the rods are applied onto the end portions of the respective laminated thin films coated on the front and back surfaces of the circuit board to thereby float part of the light transmissive films from the associated photoresist layers, and the films are peeled off from the floated portions of the light transmissive films, said method comprising the steps of:

setting the positions of said front and back rods leading ends with respect to said circuit board so as to offset each other along the surface of said circuit board;

disposing back and front backup members in such positions as to be respectively opposed to said front rod leading end and said back rod leading end through said circuit board and said laminated thin films; and moving said back and front backup members along said circuit board and said two laminated thin films respectively in synchronization with said mutually opposing front and back rod leading ends.

2. A film peeling method as set forth in claim 1, wherein the starting points of application of said vibratory motions to said laminated thin films by said rod leading ends are respectively set as the end portions of said laminated thin films on said front and back surfaces of said circuit board further distant from the end edge of an adjoining circuit board; and wherein said front and back rod leading ends as well as said back and front backup members are moved by a given distance from said starting points while said vibratory motions are being applied to said laminated thin films.

3. A film peeling method as set forth in claim 1 or 2, wherein said back and front backup members are rollers which are in rollable contact with said laminated thin films in the direction of the movements of said rods.

4. A film peeling device for peeling two laminated thin films, each consisting of a photoresist layer and a light transmissive film, respectively coated on the front and back surfaces of a circuit board, comprising:

two vibrators each including a rod respectively disposed above and below the circuit board in such a manner that they surround the circuit board from the front and back surfaces of the circuit board respectively;

wherein the positions of said front and back rods leading ends are disposed to face each other with the circuit board between them, and are set so as to offset each other along the surfaces of said circuit board;

back and front backup members respectively provided at positions opposed to said front and back rods leading ends through said circuit board and said laminated thin films and movable in contact with and along said circuit board and said laminated thin films in synchronization with said opposed front and back rods leading ends;

a film floating means for applying vibratory motions of the rods onto the end portions of the laminated thin films respectively coated on the front and back surfaces of the circuit board to thereby float part of the light transmissive films from their respective photoresist layers; and a film peeling means for peeling the films in the floated portions of the light transmissive films.

5. A film peeling device as set forth in claim 4, wherein said back and front backup members are respectively supported by support members of said back and front vibrators.

6. A film peeling device as set forth in claim 5, wherein said back and front backup members are respectively formed of hard rubber.

7. A film peeling device as set forth in claim 6, wherein said back and front backup members are respectively rollers.

8. A film peeling device as set forth in claim 7, wherein said film floating means includes rod moving means for moving said front and back rods leading ends relatively in the advancing direction of said circuit board.

9. A film peeling device as set forth in claim 8, wherein said film floating means includes:

film leading end sensors respectively for detecting the leading ends of said front and back laminated thin films in the advancing direction of said circuit board; and a control device for detecting the leading end of the laminated thin film extending from the leading end of said circuit board in the advancing direction in accordance with output signals from said film leading end sensors, and for controlling said rod moving means to position said front and back rods leading ends at said detected leading end, and for moving them by a given distance from said position in said circuit board advancing direction.

10. A film peeling device as set forth in claim 9, wherein said laminated thin film sensors each includes a pair of conductive contacts disposed spaced apart from each other in the width direction of said circuit board and contactable with the surfaces of said circuit board and said laminated thin films respectively coated on said circuit board, and also wherein said laminated thin film sensors run over said laminated thin films when said pair of conductive contacts come into contact with conductive layers respectively provided on said surfaces of said circuit board, and output a thin film detection signal when the conduction is cut off.

11. A film peeling device as set forth in claim 6, wherein said film floating means includes rod moving means for moving said front and back rods leading ends relatively in the advancing direction of said circuit board.

12. A film peeling device as set forth in claim 11, wherein said film floating means includes:

film leading end sensors respectively for detecting the leading ends of said front and back laminated thin films in the advancing direction of said circuit board; and a control device for detecting the leading end of the laminated thin film extending from the leading end of said circuit board in the advancing direction in accordance with output signals from said film leading end sensors, and for controlling said rod moving means to position said front and back rods leading ends at said detected leading end, and for moving them by a given distance from said position in said circuit board advancing direction.

13. A film peeling device as set forth in claim 12, wherein said laminated thin film sensors each includes a pair of conductive contacts disposed spaced apart from each other in the width direction of said circuit board and contactable with the surfaces of said circuit board and said laminated thin films respectively coated on said circuit board, and also wherein said laminated thin film sensors run over said laminated thin films when said pair of conductive contacts come into contact with conductive layers respectively provided on said surfaces of said circuit board, and output a thin film detection signal when the conduction is cut off.

14. A film peeling device as set forth in claim 5, wherein said back and front backup members are respectively rollers.

15. A film peeling device as set forth in claim 14, wherein said film floating means includes rod moving means for moving said front and back rods leading ends relatively in the advancing direction of said circuit board.

16. A film peeling device as set forth in claim 15, wherein said film floating means includes:

film leading end sensors respectively for detecting the leading ends of said front and back laminated thin films in the advancing direction of said circuit board; and a control device for detecting the leading end of the laminated thin film extending from the leading end of said circuit board in the advancing direction in accordance with output signals from said film leading end sensors, and for controlling said rod moving means to position said front and back rods leading ends at said detected leading end, and for moving them by a given distance from said position in said circuit board advancing direction.

17. A film peeling device as set forth in claim 16, wherein said laminated thin film sensors each includes a pair of conductive contacts disposed spaced apart from each other in the width direction of said circuit board and contactable with the surfaces of said circuit board and said laminated thin films respectively coated on said circuit board, and also wherein said laminated thin film sensors run over said laminated thin films when said pair of conductive contacts come into contact with conductive layers respectively provided on said surfaces of said circuit board, and output a thin film detection signal when the conduction is cut off.

18. A film peeling device as set forth in claim 5, wherein said film floating means includes rod moving means for moving said front and back rods leading ends relatively in the advancing direction of said circuit board.

19. A film peeling device as set forth in claim 18, wherein said film floating means includes:

film leading end sensors respectively for detecting the leading ends of said front and back laminated thin films in the advancing direction of said circuit board; and a control device for detecting the leading end of the laminated thin film extending from the leading end of said circuit board in the advancing direction in accordance with output signals from said film leading end sensors, and for controlling said rod moving means to position said front and back rods leading ends at said detected leading end, and for moving them by a given distance from said position in said circuit board advancing direction.

20. A film peeling device as set forth in claim 19, wherein said laminated thin film sensors each includes a pair of conductive contacts disposed spaced apart from each other in the width direction of said circuit board and contactable with the surfaces of said circuit board and said laminated thin films respectively coated on said circuit board, and also wherein said laminated thin film sensors run over said laminated thin films when said pair of conductive contacts come into contact with conductive layers respectively provided on said surfaces of said circuit board, and output a thin film detection signal when the conduction is cut off.

21. A film peeling device as set forth in claim 4, wherein said back and front backup members are respectively formed of hard rubber.

22. A film peeling device as set forth in claim 21, wherein said back and front backup members are respectively rollers.

23. A film peeling device as set forth in claim 22, wherein said film floating means includes rod moving means for moving said front and back rods leading ends relatively in the advancing direction of said circuit board.

24. A film peeling device as set forth in claim 23, wherein said film floating means includes:

film leading end sensors respectively for detecting the leading ends of said front and back laminated thin films in the advancing direction of said circuit board; and a control device for detecting the leading end of the laminated thin film extending from the leading end of said circuit board in the advancing direction in accordance with output signals from said film leading end sensors, and for controlling said rod moving means to position said front and back rods leading ends at said detected leading end, and for moving them by a given distance from said position in said circuit board advancing direction.

25. A film peeling device as set forth in claim 24, wherein said laminated thin film sensors each includes a pair of conductive contacts disposed spaced apart from each other in the width direction of said circuit board and contactable with the surfaces of said circuit board and said laminated thin films respectively coated on said circuit board, and also wherein said laminated thin film sensors run over said laminated thin films when said pair of conductive contacts come into contact with conductive layers respectively provided on said surfaces of said circuit board, and output a thin film detection signal when the conduction is cut off.

26. A film peeling device as set forth in claim 21, wherein said film floating means includes rod moving means for moving said front and back rods leading ends relatively in the advancing direction of said circuit board.

27. A film peeling device as set forth in claim 26, wherein said film floating means includes:

film leading end sensors respectively for detecting the leading ends of said front and back laminated thin films in the advancing direction of said circuit board; and a control device for detecting the leading end of the laminated thin film extending from the leading end of said circuit board in the advancing direction in accordance with output signals from said film leading end sensors, and for controlling said rod moving means to position said front and back rods leading ends at said detected leading end, and for moving them by a given distance from said position in said circuit board advancing direction.

28. A film peeling device as set forth in claim 27, wherein said laminated thin film sensors each includes a pair of conductive contacts disposed spaced apart from each other in the width direction of said circuit board and contactable with the surfaces of said circuit board and said laminated thin films respectively coated on said circuit board, and also wherein said laminated thin film sensors run over said laminated thin films when said pair of conductive contacts come into contact with conductive layers respectively provided on said surfaces of said circuit board, and output a thin film detection signal when the conduction is cut off.

29. A film peeling device as set forth in claim 4, wherein said back and front backup members are respectively rollers.

30. A film peeling device as set forth in claim 29, wherein said film floating means includes rod moving means for moving said front and back rods leading ends relatively in the advancing direction of said circuit board.

31. A film peeling device as set forth in claim 30, wherein said film floating means includes:

film leading end sensors respectively for detecting the leading ends of said front and back laminated thin films in the advancing direction of said circuit board; and a control device for detecting the leading end of the laminated thin film extending from the leading end of said circuit board in the advancing direction in accordance with output signals from said film leading end sensors, and for controlling said rod moving means to position said front and back rods leading ends at said detected leading end, and for moving them by a given distance from said position in said circuit board advancing direction.

32. A film peeling device as set forth in claim 31, wherein said laminated thin film sensors each includes a pair of conductive contacts disposed spaced apart from each other in the width direction of said circuit board and contactable with the surfaces of said circuit board and said laminated thin films respectively coated on said circuit board, and also wherein said laminated thin film sensors run over said laminated thin films when said pair of conductive contacts come into contact with conductive layers respectively provided on said surfaces of said circuit board, and output a thin film detection signal when the conduction is cut off.

33. A film peeling device as set forth in claim 4, wherein said film floating means includes rod moving means for moving said front and back rods leading ends relatively in the advancing direction of said circuit board.

34. A film peeling device as set forth in claim 33, wherein said film floating means includes:

film leading end sensors respectively for detecting the leading ends of said front and back laminated thin films in the advancing direction of said circuit board; and a control device for detecting the leading end of the laminated thin film extending from the leading end of said circuit board in the advancing direction in accordance with output signals from said film leading end sensors, and for controlling said rod moving means to position said front and back rods leading ends at said detected leading end, and for moving them by a given distance from said position in said circuit board advancing direction.

35. A film peeling device as set forth in claim 34, wherein said laminated thin film sensors each includes a pair of conductive contacts disposed spaced apart from each other in the width direction of said circuit board and contactable with the surfaces of said circuit board and said laminated thin films respectively coated on said circuit board, and also wherein said laminated thin film sensors run over said laminated thin films when said pair of conductive contacts come into contact with conductive layers respectively provided on said surfaces of said circuit board, and output a thin film detection signal when the conduction is cut off.

* * * * *